United States Patent
Kishimoto et al.

(10) Patent No.: US 11,726,629 B2
(45) Date of Patent: Aug. 15, 2023

(54) ELECTRONIC PRODUCT AND DISPLAY DEVICE INCLUDING AN ADHESIVE

(71) Applicant: Samsung Display Co., Ltd., Yongin-si (KR)

(72) Inventors: Hirotsugu Kishimoto, Hwaseong-si (KR); Da Som Gu, Asan-si (KR); Chul Ho Jeong, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/575,531

(22) Filed: Jan. 13, 2022

(65) Prior Publication Data

US 2022/0317791 A1 Oct. 6, 2022

(30) Foreign Application Priority Data

Mar. 31, 2021 (KR) .................. 10-2021-0042137

(51) Int. Cl.
*G06F 3/046* (2006.01)
*H10K 59/40* (2023.01)

(52) U.S. Cl.
CPC ............ *G06F 3/046* (2013.01); *H10K 59/40* (2023.02)

(58) Field of Classification Search
CPC .............................. G06F 3/046; H01L 27/323
See application file for complete search history.

(56) References Cited

U.S. PATENT DOCUMENTS

| 8,716,362 B2 | 5/2014 | Ono et al. | |
| 10,586,941 B2 | 3/2020 | Lee et al. | |
| 10,947,420 B2 | 3/2021 | Park et al. | |
| 2013/0037748 A1* | 2/2013 | Kato | C09K 11/7794 |
| | | | 252/301.36 |
| 2016/0306489 A1* | 10/2016 | Mizuhashi | G06F 3/04166 |
| 2018/0375043 A1* | 12/2018 | Jung | H01L 27/3262 |
| 2020/0403172 A1 | 9/2020 | Park et al. | |

FOREIGN PATENT DOCUMENTS

| KR | 10-2017-0084402 | 7/2017 |
| KR | 10-1790821 | 10/2017 |
| KR | 10-2024253 | 9/2019 |

* cited by examiner

*Primary Examiner* — Lisa S Landis
(74) *Attorney, Agent, or Firm* — H.C. Park & Associates, PLC

(57) ABSTRACT

A display device includes a folding area and a non-folding area. The display device includes a display panel and a front stacked structure. The display panel has a front surface. The display panel is configured to display an image on the front surface. The front stacked structure disposed on the front surface of the display panel. The front stacked structure includes an adhesive layer disposed across the folding area and the non-folding area. The adhesive layer includes an ultraviolet curable adhesive. The ultraviolet curable adhesive includes vinylsilane and hydrosilane. The adhesive layer has a storage modulus of 0.05 MPa to 0.3 MPa within a temperature range of −20° C. to 25° C.

18 Claims, 16 Drawing Sheets

ELECTRONIC PRODUCT AND DISPLAY DEVICE INCLUDING AN ADHESIVE

CROSS-REFERENCE TO RELATED APPLICATIONS

This application claims priority to and the benefit of Korean Patent Application No. 10-2021-0042137, filed Mar. 31, 2021, which is hereby incorporated by reference for all purposes as if fully set forth herein.

BACKGROUND

Field

Embodiments generally relate to an electronic product and a display device.

Discussion

Electronic products and display devices may include various components and use an adhesive to bond these components. Adhesives may be provided in the form of an adhesive layer, an adhesive sheet, an adhesive film, and/or the like, and may be classified into various types of adhesives based on adhesion mechanisms. For example, adhesives include a pressure sensitive adhesive (PSA) in which an adhesive material acts by a pressure, a thermosetting adhesive that is cured by heat, a photocurable adhesive that is cured by light energy, and the like.

Desired physical properties of the adhesives may vary depending on environments where electronic products and display devices are used and characteristics thereof. For example, in the case of electronic products designed to be deformable, it is advantageous to set a storage modulus to accommodate repetitive deformation and avoid permanent deformation.

The above information disclosed in this section is only for understanding the background of the inventive concepts, and, therefore, may contain information that does not form prior art.

SUMMARY

Some aspects provide an electronic product including an adhesive capable of repeated deformation, but whose permanent deformation is prevented.

Some aspects provide a display device including an adhesive capable of repeated deformation, but whose permanent deformation is prevented.

Additional aspects will be set forth in the detailed description which follows, and, in part, will be apparent from the disclosure, or may be learned by practice of the inventive concepts.

According to some embodiments, a display device includes a folding area and a non-folding area. The display device includes a display panel and a front stacked structure. The display panel has a front surface. The display panel is configured to display an image on the front surface. The front stacked structure disposed on the front surface of the display panel. The front stacked structure includes an adhesive layer disposed across the folding area and the non-folding area. The adhesive layer includes an ultraviolet curable adhesive. The ultraviolet curable adhesive includes vinylsilane and hydrosilane. The adhesive layer has a storage modulus of 0.05 MPa to 0.3 MPa within a temperature range of −20° C. to 25° C.

According to some embodiments, a display device includes a display panel, a first upper cover member, a second upper cover member, a third upper cover member, a first lower cover member, a second lower cover member, a third lower cover member, a first bonding layer, a second bonding layer, a third bonding layer, a fourth bonding layer, a fifth bonding layer, and a sixth bonding layer. The first upper cover member is disposed on the display panel. The second upper cover member is disposed on the first upper cover member. The third upper cover member is disposed on the second upper cover member. The first lower cover member is disposed under the display panel. The second lower cover member is disposed under the first lower cover member. The third lower cover member is disposed under the second lower cover member. The first bonding layer is disposed between the third upper cover member and the second upper cover member. The second bonding layer is disposed between the second upper cover member and the first upper cover member. The third bonding layer is disposed between the first upper cover member and the display panel. The fourth bonding layer is disposed between the display panel and the first lower cover member. The fifth bonding layer is disposed between the first lower cover member and the second lower cover member. The sixth bonding layer is disposed between the second lower cover member and the third lower cover member. Each of the first bonding layer and the second bonding layer is an ultraviolet curable layer. Each of the first bonding layer and the second bonding layer has a storage modulus of 0.08 MPa to 0.3 MPa at −20° C. and a storage modulus of 0.05 MPa to 0.2 MPa at 25° C.

According to some embodiments, an electronic product includes a first structure, a second structure, and an adhesive layer interposed between the first structure and the second structure to bond the first structure to the second structure. The adhesive layer includes an ultraviolet curable material. The adhesive layer has a storage modulus of 0.08 MPa to 0.3 MPa at −20° C. and a storage modulus of 0.05 MPa to 0.2 MPa at 25° C.

According to various embodiments, since an electronic device and/or a display include an adhesive layer capable of repeated deformation, but whose permanent deformation is prevented, it is possible to prevent deformation of the adhesive layer from being reflected in an outer shape of the electronic product or the display device that may otherwise be visually recognized by a user.

The foregoing general description and the following detailed description are illustrative and explanatory and are intended to provide further explanation of the claimed subject matter.

BRIEF DESCRIPTION OF THE DRAWINGS

The accompanying drawings, which are included to provide a further understanding of the inventive concepts, and are incorporated in and constitute a part of this specification, illustrate embodiments of the inventive concepts, and, together with the description, serve to explain principles of the inventive concepts. In the drawings.

DETAILED DESCRIPTION OF SOME EMBODIMENTS

Figure 1:
FIG. 1 is a cross-sectional view showing an electronic product according to an embodiment.

In the following description, for the purposes of explanation, numerous specific details are set forth to provide a thorough understanding of various embodiments. As used herein, the terms "embodiments" and "implementations" may be used interchangeably and are non-limiting examples employing one or more of the inventive concepts disclosed herein. It is apparent, however, that various embodiments may be practiced without these specific details or with one or more equivalent arrangements. In other instances, well-known structures and devices are shown in block diagram form to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing example features of varying detail of some embodiments. Therefore, unless otherwise specified, the features, components, modules, layers, films, panels, regions, aspects, etc. (hereinafter individually or collectively referred to as an "element" or "elements"), of the various illustrations may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. As such, the sizes and relative sizes of the respective elements are not necessarily limited to the sizes and relative sizes shown in the drawings. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element, it may be directly on, connected to, or coupled to the other element or intervening elements may be present. When, however, an element is referred to as being "directly on," "directly connected to," or "directly coupled to" another element, there are no intervening elements present. Other terms and/or phrases used to describe a relationship between elements should be interpreted in a like fashion, e.g., "between" versus "directly between," "adjacent" versus "directly adjacent," "on" versus "directly on," etc. Further, the term "connected" may refer to physical, electrical, and/or fluid connection. In addition, the X-axis, the Y-axis, and the Z-axis are not limited to three axes of a rectangular coordinate system, and may be interpreted in a broader sense. For example, the X-axis, the Y-axis, and the Z-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one element's relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing some embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional views, isometric views, perspective views, plan views, and/or exploded illustrations that are schematic illustrations of idealized embodiments and/or intermediate structures. As such, variations from the shapes of the illustrations as a result of, for example, manufacturing techniques and/or tolerances, are to be expected. Thus, embodiments disclosed herein should not be construed as limited to the particular illustrated shapes of regions, but are to include deviations in shapes that result from, for instance, manufacturing. To this end, regions illustrated in the drawings may be schematic in nature and shapes of these regions may not reflect the actual shapes of regions of a device, and, as such, are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

As customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some embodiments may be physically separated into two or more interacting and discrete blocks, units, and/or modules without departing from the inventive concepts. Further, the blocks, units, and/or modules of some embodiments may be physically combined into more complex blocks, units, and/or modules without departing from the inventive concepts.

Hereinafter, various embodiments will be explained in detail with reference to the accompanying drawings.

Figure 2:
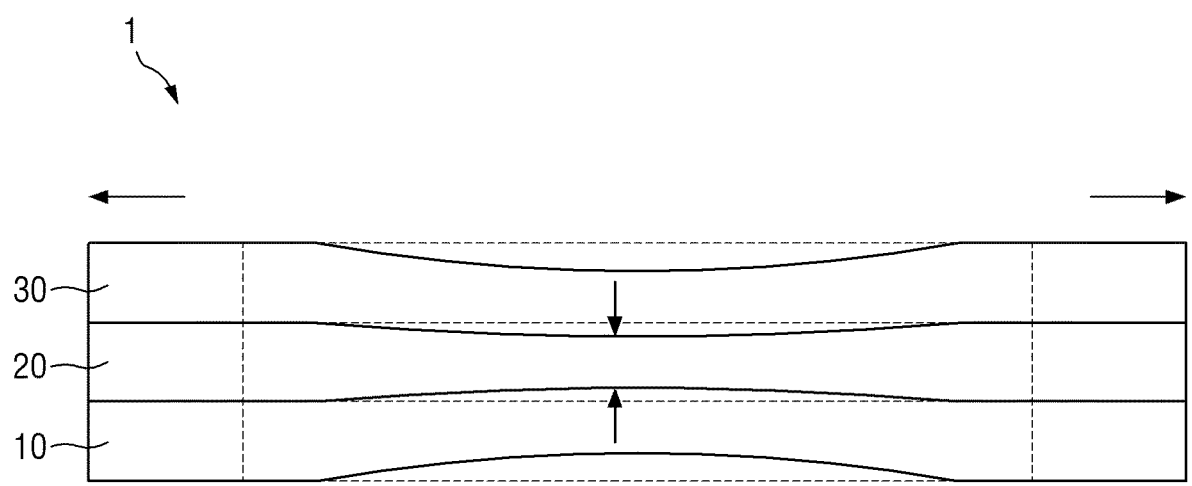
FIG. 2 is a cross-sectional view showing deformation of the outer shape of the electronic product of FIG. 1 according to an embodiment.
Figure 3:
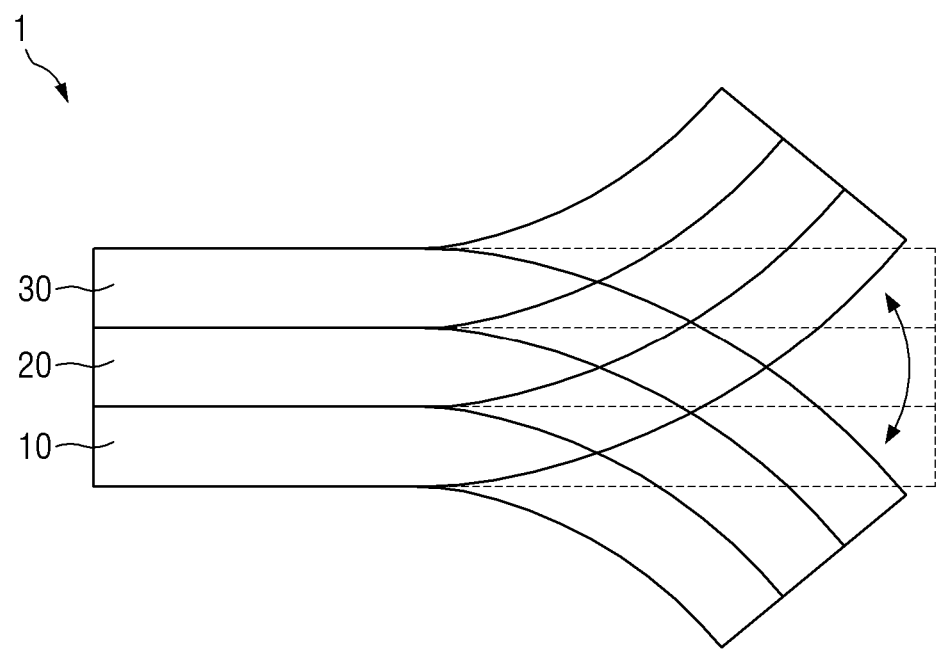
FIG. 3 is a cross-sectional view showing deformation of the outer shape of the electronic product of FIG. 1 according to an embodiment.
Figure 4:
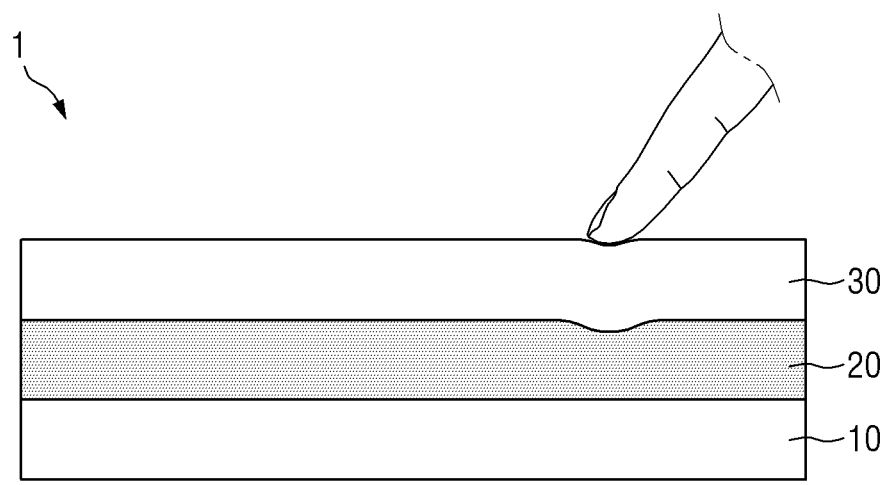
FIG. 4 is a cross-sectional view showing external pressure being applied to the electronic product of FIG. 1 according to an embodiment.

FIG. 1 is a cross-sectional view showing an electronic product according to an embodiment. FIG. 2 is a cross-sectional view showing deformation of the outer shape of the electronic product of FIG. 1 according to an embodiment. FIG. 3 is a cross-sectional view showing deformation of the outer shape of the electronic product of FIG. 1 according to an embodiment. FIG. 4 is a cross-sectional view showing an external pressure being applied to the electronic product of FIG. 1 according to an embodiment.

Electronic products include, for instance, machines, appliances, devices that operate by a current or a magnetic field, and components thereof. Examples of the electronic products may include, but are not limited to, a smartphone, a mobile phone, a tablet personal computer (PC), a personal digital assistant (PDA), a portable multimedia player (PMP), a television, a game machine, a wristwatch-type electronic device, a head-mounted display, a monitor of a PC, a laptop computer, an external billboard, an electric car, various medical devices, various household appliances, such as a refrigerator, a washing machine, etc., an Internet-of-Things (IoT) device, and/or the like.

The electronic products may include structures that perform various functions and may include an adhesive for adhering various components. The adhesive may be provided in the form of an adhesive layer, an adhesive sheet, an adhesive film, and/or the like that is disposed between various components. Although it is illustrated in FIGS. 1 to 4 that an electronic product includes two structures and one adhesive layer for adhering the two structures for simplicity of description, embodiments are not limited thereto, and the electronic product may include three or more structures and/or two or more adhesive layers.

Referring to FIGS. 1 to 3, an electronic product 1 according to one example may include a first structure 10, an adhesive layer 20 disposed on the first structure 10, and a second structure 30 disposed on the adhesive layer 20.

Each of the first structure 10 and the second structure 30 may be provided in various forms, such as a layer, a film, a sheet, a plate, and/or the like. Further, each of the first structure 10 and the second structure 30 may be formed of one layer or two or more layers. When each of the first structure 10 and the second structure 30 is formed of two or more layers, they may be made of the same material or different materials.

Each of the first structure 10 and the second structure 30 may be made of at least one of a transparent material, an opaque substance, and a translucent material, or may be made of two or more materials among at least one of a transparent material, an opaque material, and a translucent material.

Each of the first structure 10 and the second structure 30 may have any one of various properties, such as elasticity, plasticity, hardness, rigidity, ductility, brittleness, and/or the like. Each of the first structure 10 and the second structure 30 may be formed of two or more layers and have two or more properties among the above-described properties when they are made of different materials. Further, the first structure 10 and the second structure 30 may have different properties among the above-described various properties, or may have at least one same property.

Each of the first structure 10 and the second structure 30 may perform any one function or a plurality of functions. For example, they may perform at least one of various functions, such as a function of transmitting an electromagnetic signal, an insulating function for electrical separation, a support or substrate function for supporting another layer, an optical function, a buffer function, a function for preventing infiltration of an external material, a shielding function for shielding an electromagnetic signal, a heat dissipation function for releasing heat, and a light emitting function of emitting light by an electrical signal, or may perform two or more functions among non-restrictive various functions. Further, the first structure 10 and the second structure 30 may perform different functions, or may perform at least one same function.

As described above, the first structure 10 and the second structure 30 may have various structures, shapes, materials, roles, functions, and properties, and the above-described various examples are merely for understanding, but embodiments are not limited thereto.

The adhesive layer 20 may serve to adhere the first structure 10 and the second structure 30. The adhesive layer 20 may be an ultraviolet curable adhesive that is cured by ultraviolet (UV) rays, unlike a pressure sensitive adhesive (PSA) in which an adhesive material acts by a pressure.

Although it is illustrated that each of the first structure 10, the second structure 30, and the adhesive layer 20 has a rectangular cross-sectional shape, they may have various cross-sectional shapes, such as a polygonal shape, e.g., a square shape, a triangular shape, and a pentagonal shape, a circular shape, an elliptical shape, or the like.

The electronic product 1 may be designed such that an outer shape thereof is deformable by a user to improve space utilization or portability. For example, the electronic product 1 may be designed such that at least a portion of the electronic product 1 can be stretched by a tensile force applied thereto as shown in FIG. 2. Further, the electronic product 1 may be designed such that at least a portion of the electronic product 1 can be bent as shown in FIG. 3. Although not shown, the electronic product 1 may be designed such that an outer shape thereof is deformable in various shapes, such as a rolled shape, a twisted shape, and/or the like.

When the outer shape of the electronic product 1 is deformed, the outer shapes of the first structure 10 and the second structure 30 of the electronic product 1 may be deformed, and the outer shape of the adhesive layer 20 disposed between the first structure 10 and the second structure 30 may also be designed to be deformed. However, in some cases, it may be desirable to design the electronic product 1 such that the deformation of the outer shape is not permanent and the outer shape of the electronic product 1 is restored to the original shape. In this case, the adhesive layer 20 is designed such that it is easily deformed and easily restored to the original shape before the deformation. The value of the storage modulus of the adhesive layer 20 may be controlled to exhibit such properties. Here, the storage modulus means the energy stored without loss due to the elasticity of the material.

The adhesive layer 20 may have a storage modulus G' within a range of 0.05 MPa to 0.3 MPa so that the adhesive layer 20 is easily deformable and has a restoring force to be restored to the original shape before the deformation. When the adhesive layer 20 has a storage modulus greater than 0.3 MPa, the adhesive layer 20 is not easily bent, and may be buckled or peeled off. When the adhesive layer 20 has a storage modulus smaller than 0.08 MPa, the adhesive layer 20 is easily deformed, but it may be difficult to maintain the outer shape before the deformation due to large energy loss caused by repetitive deformation.

Further, a pressure may be applied to the electronic product 1 by another object or a portion of a human body (e.g., a finger) as shown in FIG. 4. In this case, the adhesive layer 20, as well as the first structure 10 and/or the second structure 30 may be deformed by the external pressure. The storage modulus may be controlled such that it is possible to restore the deformed adhesive layer 20 to the original shape by removing the external pressure. Therefore, the adhesive layer 20 may have a storage modulus within a range of 0.05 MPa to 0.2 MPa so that it is advantageous in that the adhesive layer is not permanently deformed due to a restoring force even if the external pressure is repeatedly applied. Here, the external pressure may mean a force of about 5 N to 20 N (newton).

The electronic product 1 may be used in various temperature environments. For example, the electronic product 1 may be used in an environment from a low temperature of −20° C. to room temperature of 25° C. Therefore, the storage modulus of the adhesive layer 20 may be controlled such that the product is easily deformed in various temperature environments and has a restoring force even if an external pressure is applied, as described above. For example, the adhesive layer 20 may have a storage modulus of 0.05 MPa to 0.3 MPa within the temperature range of −20° C. to 25° C. For instance, the adhesive layer 20 may have a storage modulus of 0.08 MPa to 0.3 MPa at a low temperature such as −20° C. to allow a display device to be easily bent, and may have a storage modulus of 0.05 MPa to 0.2 MPa at room temperature such as 25° C. to prevent permanent deformation caused by an external pressure. However, a storage modulus of a material having a viscoelastic property, such as the adhesive layer 20, e.g., a material that has viscosity and elasticity when its outer shape is deformed, may depend on temperature changes.

Figure 5:
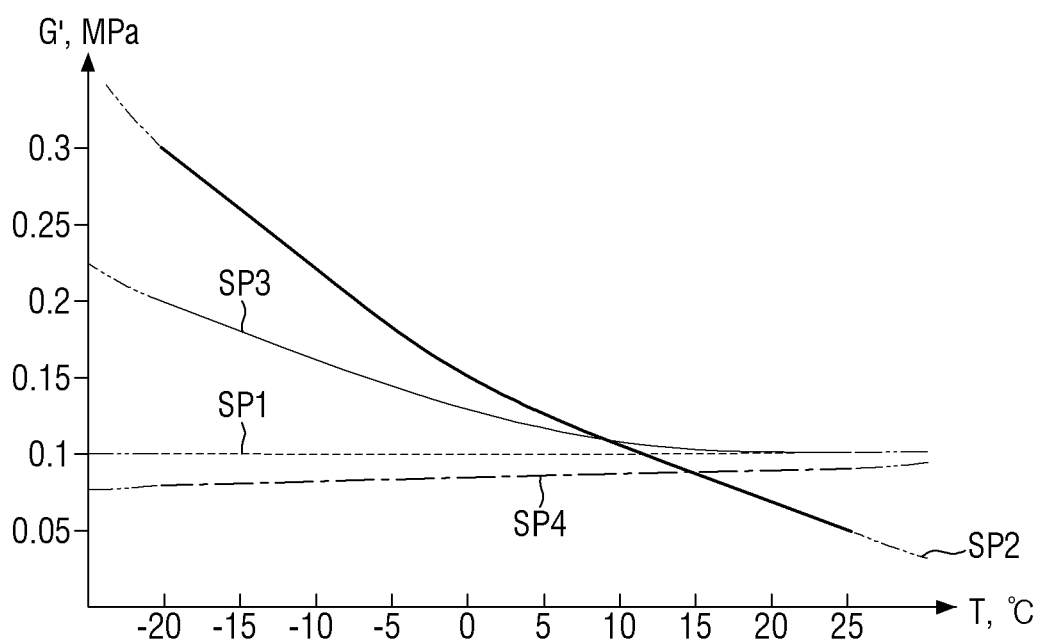
FIG. 5 is a graph showing various examples of a storage modulus depending on the temperature of the adhesive layer of FIG. 1 according to various embodiments.

FIG. 5 is a graph showing various examples of a storage modulus depending on the temperature of the adhesive layer of FIG. 1 according to an embodiment.

The change in the storage modulus with respect to the temperature of the adhesive layer 20 may be linear or non-linear. For example, the storage modulus of the adhesive layer 20 may become smaller as the temperature increases, as in a second sample SP2 and a third sample SP3 of FIG. 5, or may become greater as the temperature increases, as in a fourth sample SP4 of FIG. 5. Further, the adhesive layer 20 may have a constant storage modulus at least within the temperature range of −20° C. to 25° C., as in a first sample SP1 of FIG. 5.

For example, the first sample SP1 has a constant storage modulus of 0.1 MPa within the temperature range of −20° C. to 25° C., and the ratio of the storage modulus at −20° C. to the storage modulus at 25° C. may be 1. The storage modulus at −20° C. and the storage modulus at 25° C. of the second sample SP2 are 0.3 MPa and 0.05 MPa, respectively, and the ratio of the storage modulus at −20° C. to the storage modulus at 25° C. may be 6. The storage modulus at −20° C. and the storage modulus at 25° C. of the third sample SP3 are 0.2 MPa and 0.1 MPa, respectively, and the ratio of the storage modulus at −20° C. to the storage modulus at 25° C. may be 2. The storage modulus at −20° C. and the storage modulus at 25° C. of the fourth sample SP4 are 0.08 MPa and 0.09 MPa, respectively, and the ratio of the storage modulus at −20° C. to the storage modulus at 25° C. may be about 0.89.

Since the behavior of the storage modulus depending on the temperature of the adhesive layer 20 may vary, the ratio of the storage modulus at −20° C. to the storage modulus at 25° C. of the second sample SP2 may be 6 or more, which is relatively large compared to the other samples, e.g., the first, third, and fourth samples SP1, SP3, and SP4. However, the adhesive layer 20 in which the ratio of the storage modulus at −20° C. to the storage modulus at 25° C. is within a range of 0.5 to 2 may be employed so that it is advantageous to uniformly maintain the characteristics in which the adhesive layer 20 is easily deformed within the temperature range of −20° C. to 25° C. and has sufficient restoring force even if an external pressure is applied. In some embodiments, the ratio of the storage modulus at −20° C. to the storage modulus at 25° C. of the adhesive layer 20 may be 0.8 to 1.2.

Since the adhesive layer 20 according to an embodiment has the storage modulus of 0.05 MPa to 0.3 MPa within the temperature range of −20° C. to 25° C. and the ratio of the storage modulus at −20° C. to the storage modulus at 25° C. is within the range of 0.5 to 2, the deformation is easy within the temperature range of −20° C. to 25° C. and buckling or peeling off of the adhesive layer 20 due to deformation is prevented. Also, it may be advantageous to prevent the adhesive layer 20 from being permanently deformed by the pressure from another object or a portion of a human body.

The characteristics, such as the magnitude of the storage modulus of the adhesive layer 20 or the change in the magnitude of the storage modulus with respect to the temperature, may be controlled in various manners. For example, the adhesive layer 20 may contain vinylsilane, hydrosilane, and silane-$CH_2$—$CH_2$-silane formed by bonding vinylsilane to hydrosilane so that the adhesive layer 20 may have a storage module of 0.05 MPa to 0.3 MPa within the temperature range of −20° C. to 25° C. by adjusting the contents of the compositions and/or the content of a cross-linking agent, and the ratio of the storage modulus at −20° C. to the storage modulus at 25° C. may be adjusted to be within the range of 0.5 to 2. Hereinafter, the adhesive layer 20 will be described in more detail.

The adhesive layer 20 may contain vinylsilane and hydrosilane as an ultraviolet (UV) curable adhesive. When ultraviolet rays are irradiated, vinylsilane and hydrosilane may be bonded as silane-$CH_2$—$CH_2$-silane as shown in Chemical Formula 1. Specifically, when ultraviolet rays are irradiated, H of hydrosilane may be bonded to the bond of CH=$CH_2$ of vinylsilane. Since vinylsilane and hydrosilane are bonded as silane-$CH_2$—$CH_2$-silane, the adhesive layer 20 may be cured.

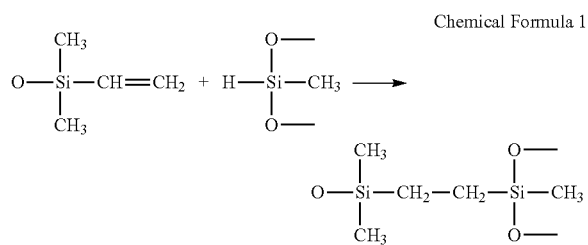

Chemical Formula 1

Since the adhesive layer 20 contains silane-$CH_2$—$CH_2$-silane formed after curing, the ratio of the storage modulus at −20° C. to the storage modulus at 25° C. may be within the range of 0.5 to 2.0. Further, by adjusting the average molecular weight of the cured adhesive layer 20, the adhesive layer 20 may have a storage modulus within the range of 0.08 MPa to 0.3 MPa at low temperatures, such as −20° C., and a storage modulus within the range of 0.05 MPa to 0.2 MPa at room temperature, such as 25° C.

The magnitudes of the storage modulus at −20° C. and the storage modulus at 25° C. and the ratio of the storage modulus at −20° C. to the storage modulus at 25° C. may be controlled by adjusting the content of vinylsilane and hydrosilane and the molecular weight of the cured adhesive layer 20. For example, the magnitude of the storage modulus may be increased when the contents of vinylsilane and hydrosilane and/or the molecular weight of the cured adhesive layer 20 is increased.

In some embodiments, the adhesive layer 20 may further contain a cross-linking agent and/or a reaction retarder.

The cross-linking agent may serve as a cross-link between polymer chains to adjust a mechanical strength, such as hardness or elasticity, of the adhesive layer 20. For example, the cross-linking agent may contain at least one of vinylsilane, hydroxysilane, alkoxysilane, and epoxysilane. For instance, vinylsilane that is a cross-linking agent may serve as a cross-link. The storage modulus of the adhesive layer 20 may be increased as the content of the cross-linking agent becomes higher. Therefore, the magnitude of the storage modulus may be adjusted by adjusting the content of the cross-linking agent.

The reaction retarder serves to suppress silane-$CH_2$—$CH_2$-silane bonding between vinylsilane and hydrosilane. For example, the reaction retarder may include at least one of triphenylphosphine, tributylamine, tetramethylethylenediamine, benzotriazole, acetylenediol, a peroxide compound, and maleic acid.

Since the adhesive layer 20 may contain the reaction retarder, the semi-cured state may be maintained for about 30 minutes to 1 hour after the irradiation of ultraviolet rays. The adhesive layer 20 may maintain an adhesive strength in a semi-cured state. Therefore, the adhesive layer 20 in a semi-cured state may attach the second structure 30 onto the first structure 10.

Figure 6:
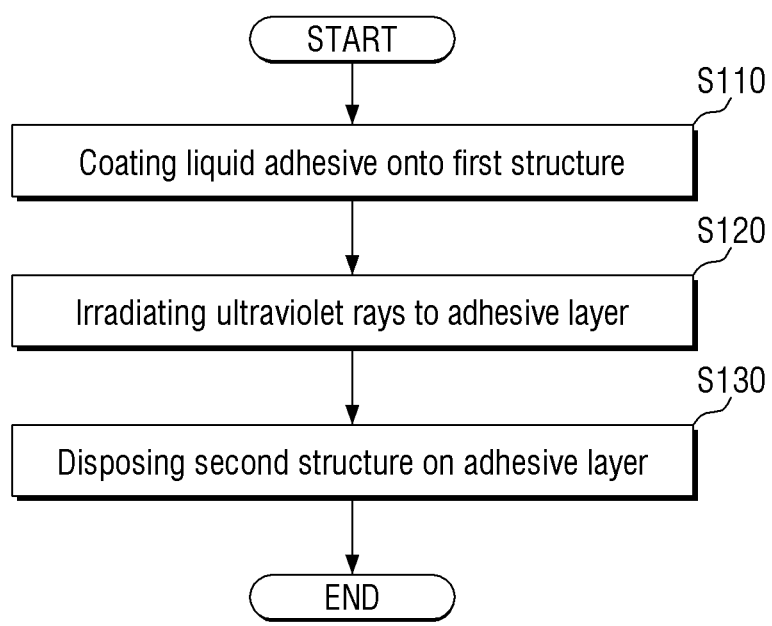
FIG. 6 is a flowchart showing a process of forming an adhesive layer according to an embodiment.
Figure 7:
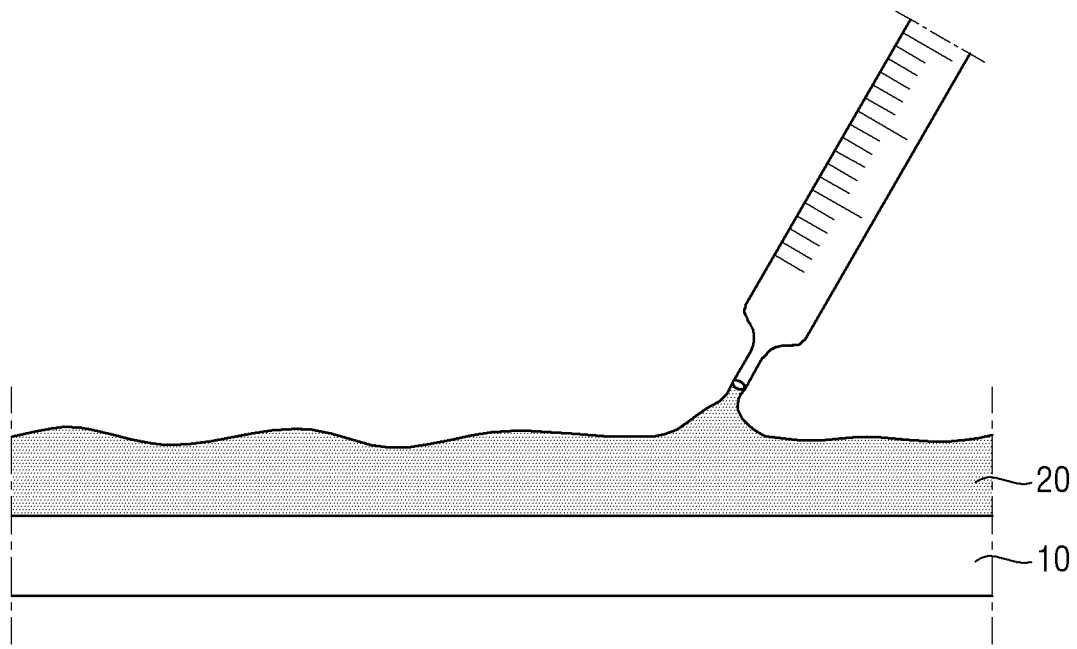
FIGS. 7, 8, and 9 are cross-sectional views illustrating a process of forming an adhesive layer according to an embodiment.
Figure 8:
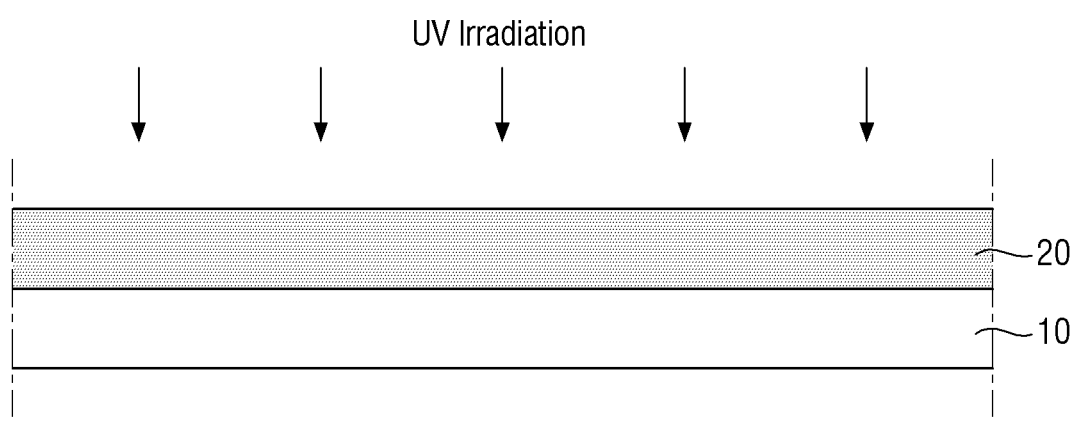
Figure 9:
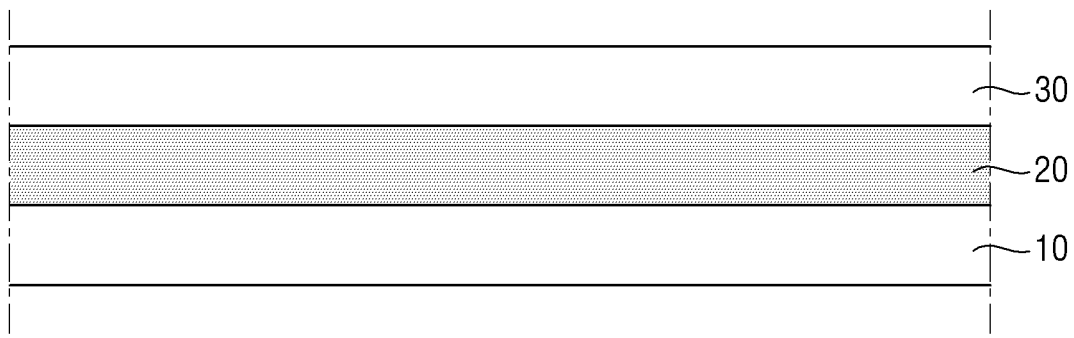

FIG. 6 is a flowchart showing a process of forming an adhesive layer according to an embodiment. FIGS. 7, 8, and 9 are cross-sectional views illustrating a process of forming an adhesive layer according to an embodiment. In the following, the process of forming the adhesive layer of FIG. 1 will be described in more detail with reference to FIGS. 6 to 9.

First, as shown in FIG. 7, a liquid adhesive containing vinylsilane, hydrosilane, and a reaction retarder is coated onto the first structure 10 (step S110).

The adhesive may be coated in a liquid solution state by various methods, such as at least one of an inkjet printing method, an inkjet injection method, a slot die coating method, a slot die printing method, and the like. Since the adhesive is coated in a liquid state, the surface of the adhesive layer 20 may become flat as a predetermined period of time elapses. Here, the predetermined period of time may be about 1 to 5 minutes.

Next, as shown in FIG. 8, ultraviolet (UV) rays are irradiated to the adhesive layer 20 (step S120).

Due to the irradiation of ultraviolet rays, the adhesive layer 20 may contain silane-$CH_2$—$CH_2$-silane produced by the reaction of vinylsilane and hydrosilane. In this manner, the adhesive layer 20 may be cured. Since, however, the reaction retarder is contained, the adhesive layer 20 may maintain a semi-cured state for about 30 minutes to 1 hour after the irradiation of ultraviolet rays. Therefore, the adhesive layer 20 may maintain an adhesive strength for about 30 minutes to 1 hour after the irradiation of ultraviolet rays.

Next, the second structure 30 is disposed on the adhesive layer 20 as shown in FIG. 9 (step S130).

Although not limited to the following, the second structure 30 may be disposed on the adhesive layer 20 within about 30 minutes to 1 hour after the ultraviolet rays are irradiated to the adhesive layer 20. For instance, the second structure 30 may be disposed on the adhesive layer 20 in a semi-cured state before the adhesive layer 20 is completely cured so that the first structure 10 and the second structure 30 may be adhered.

In another example, when the first structure 10 is transparent, the first structure 10 and the second structure 30 may be adhered by the adhesive layer 20 by providing the first structure 10 on the adhesive layer 20 in a liquid state and then curing the adhesive layer by irradiating ultraviolet rays.

Since the adhesive layer 20 for adhering the first structure 10 and the second structure 30 contains an ultraviolet curable adhesive containing silane-CH$_2$—CH$_2$-silane, the adhesive layer 20 has a storage modulus of 0.05 MPa to 0.3 MPa within the temperature range of −20° C. to 25° C. and the ratio of the storage modulus at −20° C. to the storage modulus at 25° C. is within a range of 0.5 to 2. Accordingly, it may be advantageous to uniformly maintain the characteristics in which the adhesive layer 20 is easily deformed within the above-described temperature range and has the restoring force even if an external pressure is applied.

Figure 10:
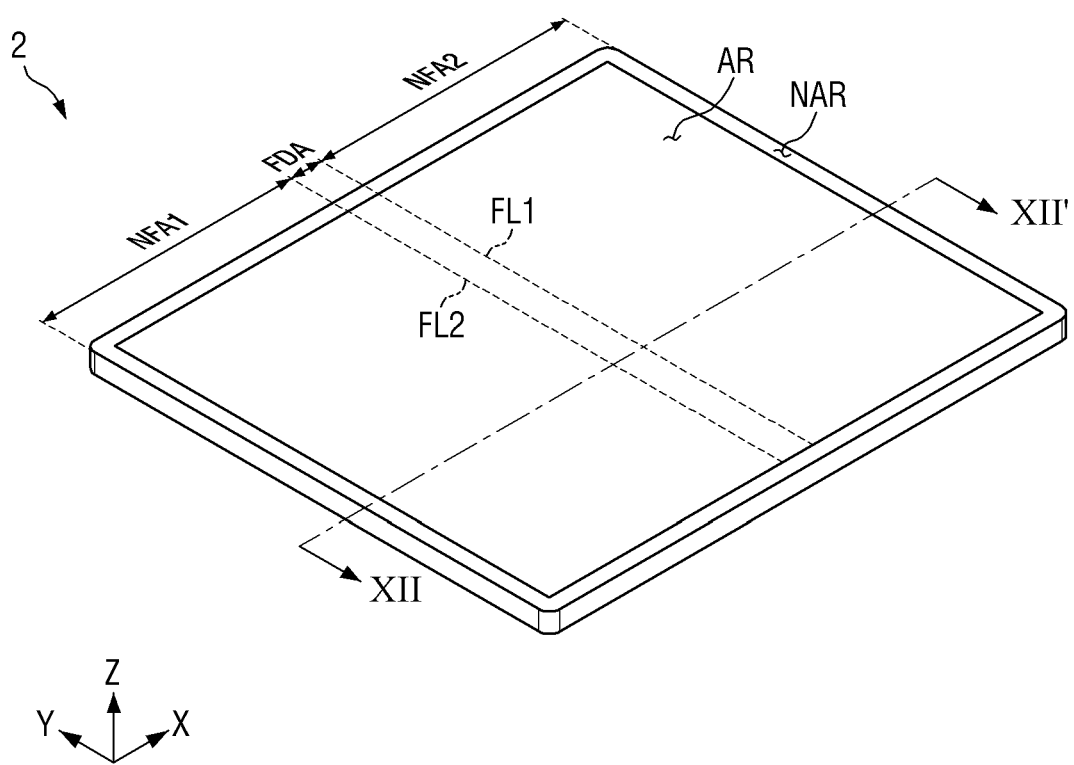
FIG. 10 is a perspective view of a display device according to an embodiment.
Figure 11:
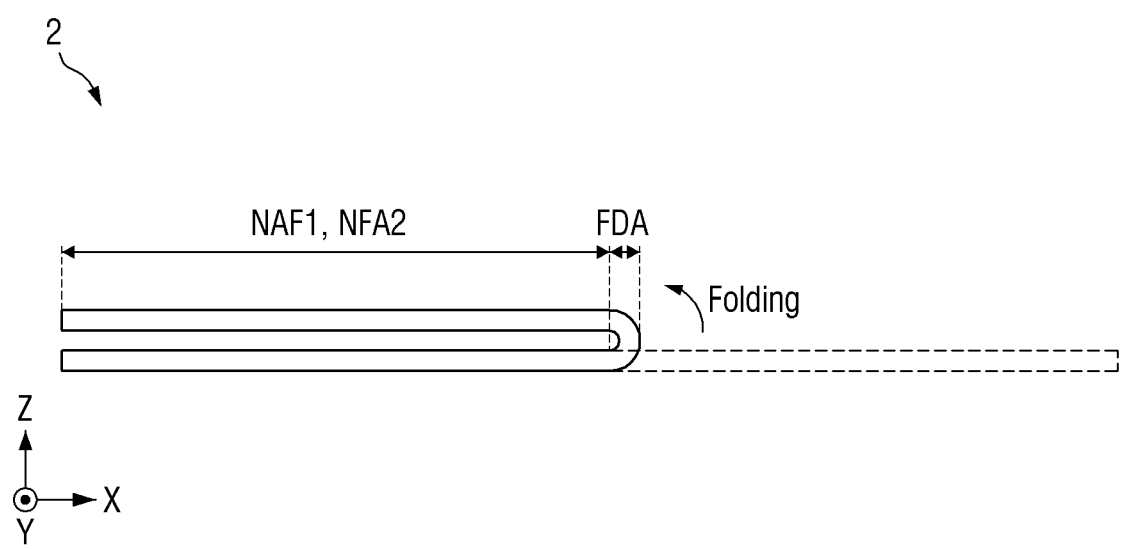
FIG. 11 is a diagram showing a folded state of the display device of FIG. 10 according to an embodiment.
Figure 12:
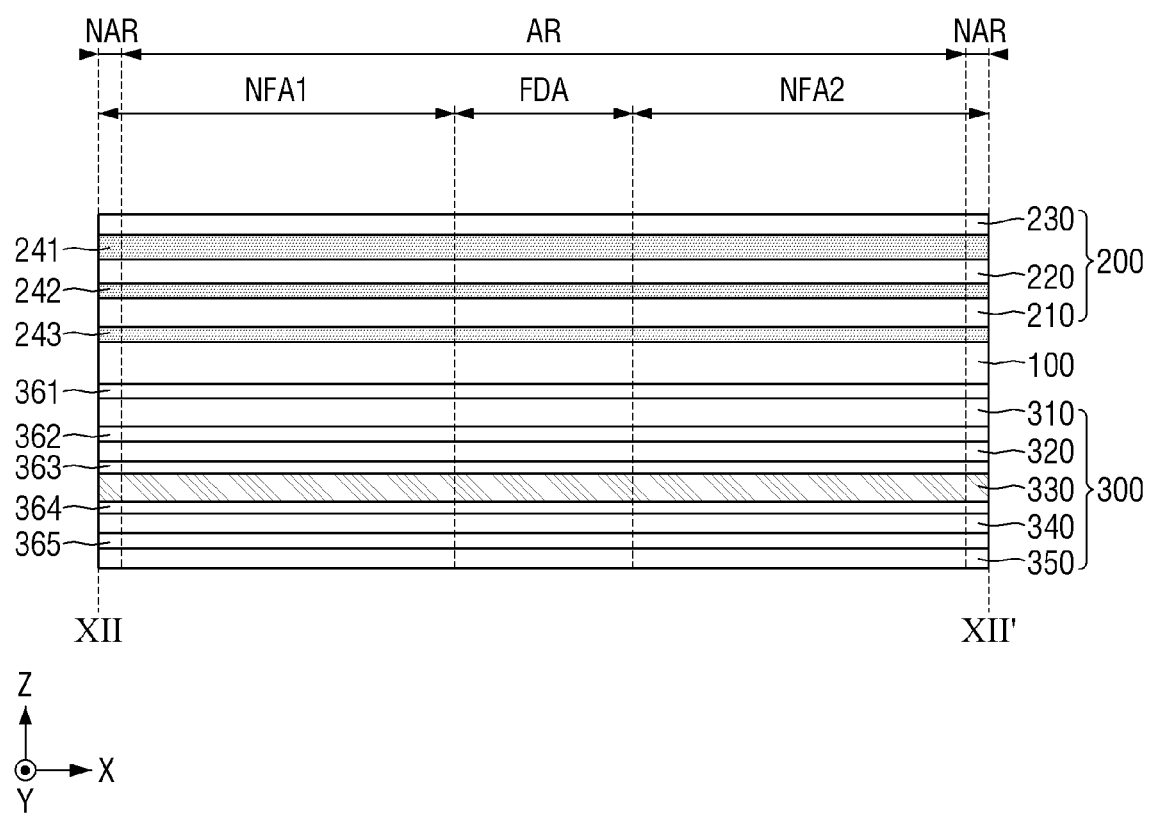
FIG. 12 is a cross-sectional view showing the display device of FIG. 10 according to an embodiment.

FIG. 10 is a perspective view of a display device according to an embodiment. FIG. 11 is a diagram showing a folded state of the display device of FIG. 10 according to an embodiment. FIG. 12 is a cross-sectional view showing the display device of FIG. 10 according to an embodiment.

Hereinafter, a more specific embodiment of the case where a display device is an example of an electronic product will be described. However, embodiments are not limited to the display device, and may be applied to other electronic products, such as the above-described various electronic products.

Further, a foldable display device may be an example of a display device whose outer shape is deformable. The foldable display device may be bent, folded, and unfolded by a user and may support a touch input using a portion of a body (e.g., a finger) or an external object (e.g., an electronic pen). Therefore, in the following, the foldable display device will be described as one of the embodiments suitable for describing the adhesive layer whose outer shape is deformable, but permanent deformation by an external pressure is prevented. Although not specifically shown in the drawings, similarly to the foldable display device, various types of flexible display devices, such as a bendable display device, a rollable display device, a twistable display device, and a stretchable display device may have deformable outer shapes, and an external pressure may be applied thereto. Therefore, it may be understood that the following may be applied to various types of flexible display devices in substantially the same manner.

In FIGS. 10 to 12, a first direction X, a second direction Y, and a third direction Z are illustrated. The first direction X may be a direction parallel to one side of a display device 2 in plan view and may be, for example, a horizontal direction of the display device 2. The second direction Y may be a direction parallel to the other side in contact with one side of the display device 2 in plan view and may be, for example, a vertical direction of the display device 2. The third direction Z may be a thickness direction of the display device 2. It should be understood, however, that a direction mentioned in the various embodiments refers to a relative direction and the embodiments are not limited to the direction mentioned.

Referring to FIGS. 10 and 11, the display device 2 may be formed in a substantially rectangular or square shape in plan view. The display device 2 may have a rectangular shape with rounded or right-angled corners in plan view, but embodiments are not limited thereto. The display device 2 may include four sides or edges, but embodiments are not limited thereto.

At least one of the front surface and the rear surface of the display device 2 may be a display surface. Here, the "front surface" means a surface (one surface) located on one side of one plane, and the "rear surface" means a surface (the other surface; the opposite surface of one surface) located on the other side of one plane.

In one embodiment, the display surface may be located on the front surface of the display device 2, and an image may not be displayed on the rear surface. In the following, such an embodiment will be mainly described, but the display device 2 may be a double-sided display device 2 in which an image is displayed on both the front surface and the rear surface.

The display device 2 includes an active region AR and a non-active region NAR. In the display device 2, on the assumption that an area where a screen is displayed is defined as a display area, an area where a screen is not displayed is defined as a non-display area, and an area where a touch input by a portion of the body (e.g., a finger) is detected is defined as a touch area, the display area and the touch area may be included in the active region AR. The display area and the touch area may overlap each other. For instance, the active region AR may be a region where the screen is displayed and the touch input is detected. The active region AR may have a rectangular shape or a rectangular shape with rounded corners. The illustrated active region AR has a rectangular shape with right-angled corners and having a length in the first direction X longer than that in the second direction Y. However, embodiments are not limited thereto, and the active region AR may have various shapes, such as a rectangular shape having a length in the second direction Y longer than that in the first direction X, a square shape, other polygonal shapes, a circular shape, an elliptical shape, and/or the like.

The active region AR may include a plurality of pixels. The pixel is a basic unit for displaying a screen. The pixels may include, but are not limited to, a red pixel, a green pixel, and a blue pixel respectively configured to display a red color, a green color, and a blue color. The pixels may further include a white pixel configured to display a white color. The plurality of pixels may be alternately arranged in plan view. For example, the pixels may be arranged in a matrix arrangement, but embodiments are not limited thereto.

Since the active region AR includes the touch area, a pressure may be applied when a portion of a body is in contact with the front surface. At least one adhesive layer located in the active region AR may have a storage modulus that is sufficient for the outer shape to be deformed by the pressure of the touch and restored to the original shape before the pressure is applied by removing the pressure.

The non-active region NAR is disposed around the active region AR. The non-active region NAR may surround all sides (four sides in the drawing) of the active region AR. However, embodiments are not limited thereto, and the active region AR may be partially surrounded by the non-active region NAR. For example, the non-active region NAR may be disposed only around three sides of the display area. In this case, the other side of the display area may form the edge of display device 2.

In the non-active region NAR, signal wires and/or driving circuits for applying a signal to the active region AR (display area or touch area) may be disposed. The non-active region NAR may not include the display area. A black matrix may be disposed in the non-active region NAR to prevent light emitted from adjacent pixels from leaking out. Furthermore, the non-active region NAR may not include the touch area. In other embodiments, the non-active region NAR may include a portion of the touch area. In this case, the external pressure is applied by the touch so that at least one adhesive layer located in the non-active region NAR may have a storage modulus that is sufficient for the outer shape to be deformed by the pressure from the touch and restored to the original shape before the pressure is applied by removing the pressure.

The display device 2 may be a foldable display device 2 capable of maintaining both a folded state and an unfolded state. The display device 2 may include at least one or more adhesive layers, as will be described later. Among them, at least one adhesive layer disposed across a first non-folding area NFA1, a folding area FDA, and a second non-folding area NFA2 may have a storage modulus that allows the display device 2 to be easily deformed to maintain both the folded state and the unfolded state and to be restored to the state before the folding.

In one embodiment, the display device 2 may be folded in an in-folding manner in which the display surface is disposed on the inside thereof as shown in FIG. 11. When the display device 2 is folded in an in-folding manner, the front surfaces of the display device 2 may face each other. In another example, the display device 2 may be folded in an out-folding manner in which the display surface is disposed on the outside thereof. When the display device 2 is folded in the out-folding manner, the rear surfaces of the display device 2 may face each other.

The display device 2 may include a folding area FDA, a first non-folding area NFA1, and a second non-folding area NFA2. The folding area FDA may be an area in which the display device 2 is folded or bent, and the first and second non-folding areas NFA1 and NFA2 may be areas in which the display device 2 is not folded or bent.

The first non-folding area NFA1 may be disposed on one side of the folding area FDA, and the second non-folding area NFA2 may be disposed on the other side of the folding area FDA.

The folding area FDA may be defined by a first folding line FL1 and a second folding line FL2. The first folding line FL1 may correspond to the boundary between the folding area FDA and the first non-folding area NFA1, and the second folding line FL2 may correspond to the boundary between the folding area FDA and the second non-folding area NFA2.

Each of the first folding line FL1 and the second folding line FL2 may be a straight line. In one embodiment, the first folding line FL1 and the second folding line FL2 may cross the display device 2 along the second direction Y of the display device 2. The first folding line FL1 and the second folding line FL2 may have a constant gap therebetween along an extension direction.

The length of the first folding line FL1 and the length of the second folding line FL2 may be the same and may be equal to the width of the folding area FDA in the second direction Y. The width of the first non-folding area NFA1 and the width of the second non-folding area NFA2 in the second direction Y may be the same and may be equal to the width of the folding area FDA in the second direction Y. However, embodiments are not limited to the above example.

When the first folding line FL1 and the second folding line FL2 extend in the second direction Y, the width of the folding area FDA in the first direction X may be smaller than the width of the folding area FDA in the second direction Y. The width of the folding area FDA in the first direction X may be smaller than the width of the first non-folding area NFA1 and the width of the second non-folding area NFA2 in the first direction X.

The width of the first non-folding area NFA1 and the width of the second non-folding area NFA2 in the first direction X may be the same, but embodiments are not limited thereto. Further, the width of the first non-folding area NFA1 and the width of the second non-folding area NFA2 in the first direction X may be smaller than the width of the first non-folding area NFA1 and the width of the second non-folding area NFA2 in the second direction Y, but embodiments are not limited thereto.

Each of the active region AR and the non-active region NAR may overlap at least one of the folding area FDA, the first non-folding area NFA1, and the second non-folding area NFA2. FIGS. 10 and 11 illustrate the case where each of the active region AR and the non-active region NAR overlaps the folding area FDA, the first non-folding area NFA1, and the second non-folding area NFA2. For example, as illustrated in FIGS. 10 and 11, each of the active region AR and the non-active region NAR may be arranged continuously regardless of the boundaries of the folding area FDA, the non-folding area FDA, the folding lines, or the like.

Referring to FIG. 12, the display device 2 may include a display panel 100, a front stacked structure 200 disposed on the front surface of the display panel 100, and a rear stacked structure 300 disposed on the rear surface of the display panel 100. Each of the front stacked structure 200 and the rear stacked structure 300 may include at least one adhesive layer to be adhered onto the display panel 100.

The display panel 100 is a panel for displaying a screen or an image. Examples of the display panel 100 may include not only a self-light emitting display panel, such as an organic light emitting display (OLED) panel, an inorganic electroluminescence (EL) display panel, a quantum dot light emitting display (QED) panel, a micro-LED display panel, a nano-LED display panel, a plasma display panel (PDP), a field emission display (FED) panel and a cathode ray tube (CRT) display panel, but also a light receiving display panel, such as a liquid crystal display (LCD) panel and an electrophoretic display (EPD) panel. In the following, the organic light emitting display panel as the display panel 100 will be referred to as the display panel 100. However, embodiments are not limited to the organic light emitting display panel, and other display panels mentioned above or known in the art may be applied.

Figure 13:
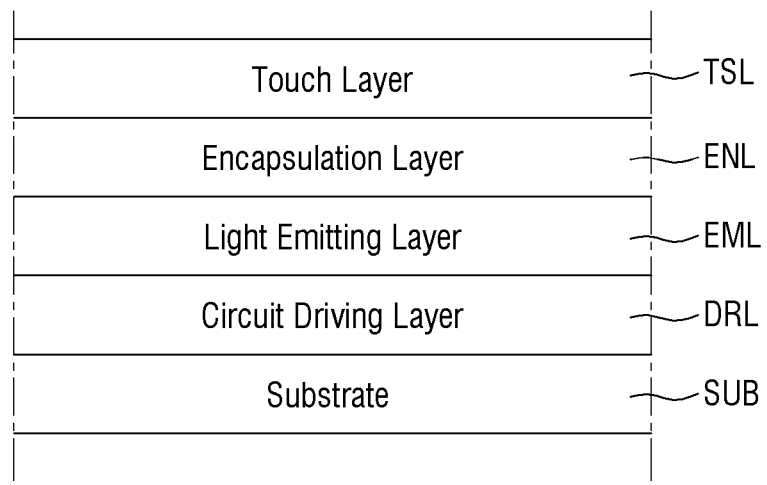
FIG. 13 is a cross-sectional view showing a display panel according to an embodiment.
Figure 13:
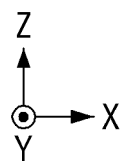

FIG. 13 is a cross-sectional view showing an example of a display panel according to an embodiment.

Referring to FIG. 13, the display panel 100 may include a substrate SUB, a circuit driving layer DRL on the substrate SUB, a light emitting layer EML on the circuit driving layer DRL, an encapsulation layer ENL on the light emitting layer EML, and a touch layer TSL on the encapsulation layer ENL.

The substrate SUB may be a flexible substrate including a flexible polymer material, such as polyimide or the like. Accordingly, the display panel 100 can be curved, bent, folded, twisted, or rolled. In some embodiments, the substrate SUB may include a plurality of sub-substrates overlapping in a thickness direction with a barrier layer interposed therebetween. In this case, each sub-substrate may be a flexible substrate.

The circuit driving layer DRL may be disposed on the substrate SUB. The circuit driving layer DRL may include a circuit that drives the light emitting layer EML of the pixel. The circuit driving layer DRL may include a plurality of thin film transistors and one or more capacitors, but embodiments are not limited thereto.

The light emitting layer EML may be disposed on the circuit driving layer DRL. The light emitting layer EML may include an organic light emitting element. The light emitting layer EML may emit light with various luminance levels according to a driving signal transmitted from the circuit driving layer DRL.

The encapsulation layer ENL may be disposed on the light emitting layer EML. The encapsulation layer ENL may include at least one inorganic layer to prevent oxygen or moisture from permeating into the light emitting layer EML. In addition, the encapsulation layer ENL may include at least one organic layer to protect the light emitting layer EML from foreign substances, such as dust.

The touch layer TSL may be disposed on the encapsulation layer ENL. The touch layer TSL is a layer for recognizing a touch input, and may function as a touch member. The touch layer TSL may include a touch area located in the active region AR and a non-touch area located in the non-active region NAR. The shape of the touch area and the shape of the non-touch area may be substantially the same as the above-described shapes of the active region AR and the non-active region NAR, but embodiments are not limited thereto, and at least a portion of the non-active region NAR may include the touch area. The touch layer TSL may include a plurality of sensing areas and sensing wires. The sensing areas and the sensing wires may be arranged in the touch area.

FIG. 13 illustrates a case where a touch member is integrated into (or as part of) the display panel 100 in the form of the touch layer TSL, but embodiments are not limited thereto. For example, the touch member may be provided as a separate panel from the display panel 100 or as a film and attached to the display panel 100. In this case, the touch member may be included in the front stacked structure 200.

Referring back to FIG. 12, the front stacked structure 200 and the rear stacked structure 300 arranged on the display panel 100 may include layers that perform different functions. The front stacked structure 200 on which a screen is displayed may include, e.g., a window 220, a window protective film 230, a polarizing film 210, and/or adhesive layers 241 to 243 for adhering them. Since the screen is displayed on the front surface of the display panel 100, the window 220, the window protective film 230, the polarizing film 210, and the adhesive layers 241 to 243 included in the front stacked structure 200 may be transparent. The rear stacked structure 300 disposed on the rear surface of the display panel 100 where the screen is not displayed may include a panel lower protective film 310, a buffer member 320, a supporting member 330, a digitizer layer 340, a shielding member 350, and/or adhesive layer 361 to 365 for adhering them.

In some embodiments, the polarizing film 210 may be attached to the front surface of the display panel 100 through the third adhesive layer 243. The polarizing film 210 may serve to reduce reflection of external light.

The window 220 may be disposed on the polarizing film 210. The window 220 may be made of a transparent material and may contain, e.g., glass or plastic. When the window 220 contains glass, an ultra-thin glass (UTG) with a thickness of 0.1 mm or less may be applied to provide a flexible property. When the window 220 contains plastic, the window 220 may contain a transparent polyimide film, but embodiments are not limited thereto. The window 220 may be attached to the front surface of the polarizing film 210 via the second adhesive layer 242.

The window protective film 230 may be disposed on the window 220. The window protective film 230 may be adhered onto the front surface of the window 220 through the first adhesive layer 241. The window protective film 230 may perform at least one of functions of prevention of scattering, impact absorption, prevention of scratch, and prevention of glare on the window 220. The window protective film 230 may contain a resin and/or a film having a flexible property.

The above-described front stacked structure 200 may be disposed across the first non-folding area NFA1, the folding area FDA, and the second non-folding area NFA2 of the display device 2. Therefore, at least one of the first to third adhesive layers 241 to 243 may have a storage modulus within a range of 0.05 MPa to 0.3 MPa to be easily folded and restored to the original shape before the folding.

Since the polarizing film 210, the window 220, and the window protective film 230 have flexible properties, when an external pressure is applied from the front surface of the display device 2, the outer shapes of the first to third adhesive layers 241 to 243 for adhering them may be deformed. Therefore, at least one of the first to third adhesive layers 241 to 243 may have a storage modulus within the range of 0.05 MPa to 0.3 MPa to prevent permanent deformation due to the restoring force even if deformation occurs by an external pressure. Since the external pressure is applied from the front surface of the display device 2, when the first adhesive layer 241 for adhering the window protective film 230 and the window 220 has the storage modulus within the range of 0.05 MPa to 0.3 MPa, it is advantageous to prevent the deformation of the first adhesive layer 241 by the external pressure from being reflected in the front surface of the display device 2 and recognized by a user.

At least one of the first to third adhesive layers 241 to 243 may be substantially the same as the adhesive layer of FIG. 1. For instance, at least one of the first to third adhesive layers 241 to 243, which is a transparent ultraviolet curable adhesive containing vinylsilane and hydrosilane, is cured by ultraviolet rays, and thus, may contain silane-$CH_2$—$CH_2$-silane.

For example, the first adhesive layer 241 may be substantially the same as the adhesive layer 20 of FIG. 1, and each of the other adhesive layers 242 and 243 may contain a transparent adhesive film or a transparent adhesive resin. Further, the first adhesive layer 241 and any one of the second adhesive layer 242 and the third adhesive layer 243 may be substantially the same as the adhesive layer 20 of FIG. 1, and the other one may contain a transparent adhesive film or a transparent adhesive resin. Alternatively, all the first to third adhesive layers 241 to 243 may be substantially the same as the adhesive layer 20 of FIG. 1.

It may be more advantageous to prevent permanent deformation even if an external pressure is applied from the front surface of the display device 2 when at least two of the first to third adhesive layers 241 to 243 contain an ultraviolet curable adhesive containing silane-$CH_2$—$CH_2$-silane than when any one of the first to third adhesive layers 241 to 243 contains an ultraviolet curable adhesive containing silane-$CH_2$—$CH_2$-silane.

Each of the first to third adhesive layers 241 to 243 may have a thickness of 10 µm to 100 µm. When the first to third adhesive layers 241 to 243 have a thickness smaller than 10 µm, they are easily deformed, but may not be easily restored to the shape before the deformation. Further, when the first to third adhesive layers 241 to 243 have a thickness greater than 100 µm, it may be difficult to bend the display device 2, and buckling or peeling off may occur due to repeated deformation.

The panel lower protective film 310 may be disposed on the rear surface of the display panel 100. The panel lower protective film 310 may be adhered onto the rear surface of the display panel 100 through the fourth adhesive layer 361. The panel lower protective film 310 may serve to support the display panel 100 and protect the rear surface of the display panel 100. The panel lower protective film 310 may include, but is not limited to, a plastic film, such as a polyethylene terephthalate (PET) film or the like.

The buffer member 320 may be disposed on the rear surface of the panel lower protective film 310. The buffer member 320 may be attached to the rear surface of the panel lower protective film 310 through the fifth adhesive layer 362. The buffer member 320 may absorb an external impact applied from the rear surface of the display device 2 to prevent the display panel 100 from being damaged. The buffer member 320 may include an elastic material, such as a rubber, a urethane-based material, a sponge in which an acrylic-based material is foam-molded, or the like.

The supporting member 330 may be disposed on the rear surface of the buffer member 320. The supporting member 330 may be attached onto the rear surface of the buffer member 320 through the sixth adhesive layer 363. The supporting member 330 may serve to support the display panel 100 together with the panel lower protective film 310 and protect the rear surface of the display panel 100. Further, the supporting member 330 may be disposed on the front surface of the digitizer layer 340 to be described later to serve to support the digitizer layer 340 and protect the front surface of the digitizer layer 340.

The supporting member 330 may be made of a rigid material. The supporting member 330 may contain, but is not limited to, at least one of metal materials, such as iron, chromium, nickel, and manganese, or may contain steel use stainless (SUS) that is an alloy thereof. The supporting member 330 may include at least one opening disposed in the folding area FDA to allow the display device 2 to be folded easily.

The digitizer layer 340 may be disposed on the rear surface of the supporting member 330. The digitizer layer 340 may be attached onto the rear surface of the supporting member 330 by the seventh adhesive layer 364. The digitizer layer 340 may include conductive patterns for detecting access or contact of an electronic pen, such as a stylus pen that supports electromagnetic resonance (EMR). The conductive patterns of the digitizer layer 340 may be configured to detect magnetic or electromagnetic signals. For example, when an electronic pen is positioned on the front surface of the display device 2 and used to generate a magnetic field or an electromagnetic signal, the generated magnetic field or electromagnetic signal may be input to the conductive patterns of the digitizer layer 340. The digitizer layer 340 may analyze the magnitude of the magnetic field or the electromagnetic signal input for each location to determine the coordinates input by the electronic pen.

In the case where the display device 2 includes the digitizer layer 340 for supporting the input of the electronic pen, a pressure may be applied to the front surface of the display device 2 when a user touches the front surface of the display device 2 with the electronic pen or drops the electronic pen on the front surface of the display device 2. Therefore, as described above, at least one of the first to third adhesive layers 241 to 243 may have the storage modulus within the range of 0.05 MPa to 0.3 MPa to prevent permanent deformation due to the restoring force even if deformation occurs by an external pressure.

Figure 14:
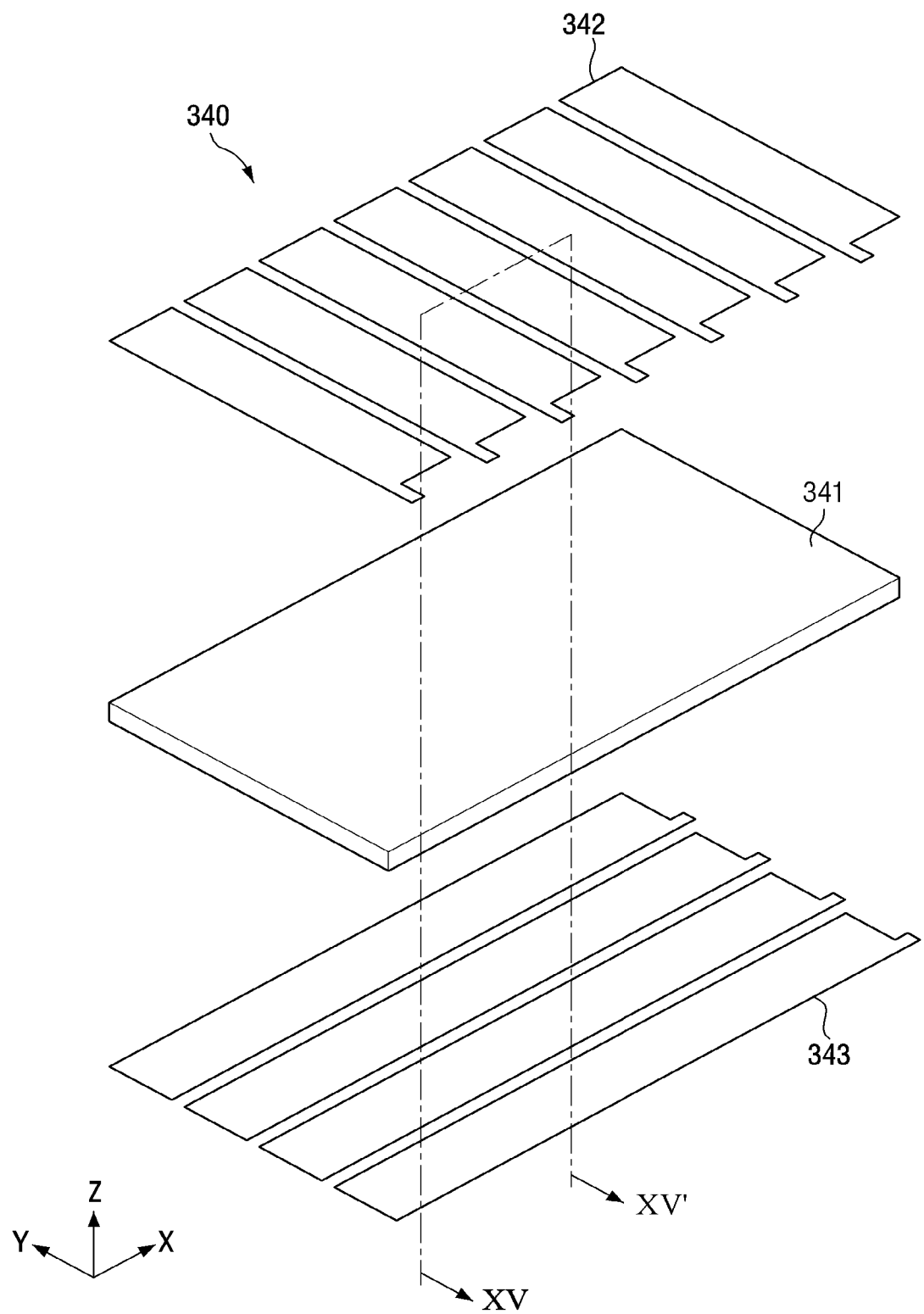
FIG. 14 is an exploded perspective view of a digitizer layer according to an embodiment.
Figure 15:
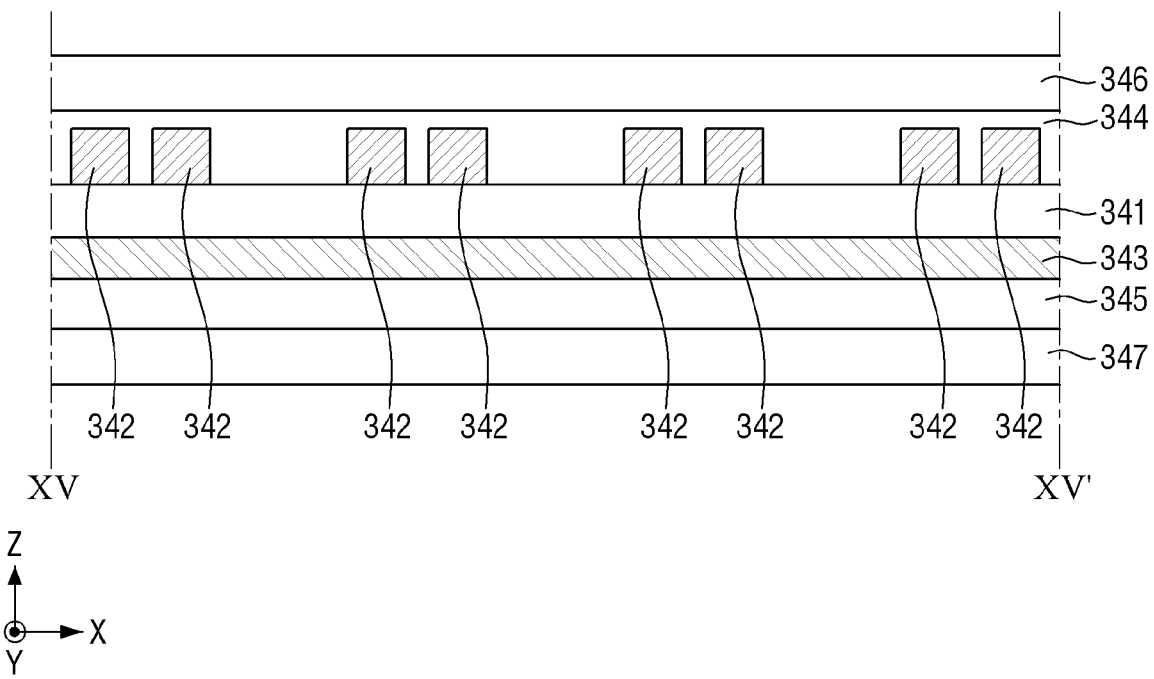
FIG. 15 is a cross-sectional view of the digitizer layer of FIG. 14 according to an embodiment.

FIG. 14 is an exploded perspective view of a digitizer layer according to an embodiment. FIG. 15 is a cross-sectional view of the digitizer layer of FIG. 14 according to an embodiment.

Referring to FIGS. 14 and 15, the digitizer layer 340 according to one example may include a base layer 341, first conductive patterns 342 disposed on the front surface of the base layer 341, a first bonding member 344 disposed on the front surfaces of the first conductive patterns 342, a first cover layer 346 disposed on the front surface of the first bonding member 344, second conductive patterns 343 formed on the rear surface of the base layer 341, a second bonding member 345 disposed on the rear surfaces of the second conductive patterns 343, and a second cover layer 347 disposed on the rear surface of the second bonding member 345.

The base layer 341 may serve as a substrate on which the first conductive patterns 342 and the second conductive patterns 343 are arranged. The base layer 341 may contain an insulating material. For example, the base layer 341 may contain polyimide, but embodiments are not limited thereto.

The first conductive patterns 342 may be arranged on the front surface of the base layer 341. Each of the first conductive patterns 342 may extend along the first direction X. The first conductive patterns 342 may be arranged (or spaced apart from one another) along the second direction Y. Each of the first conductive patterns 342 may have a planar shape of a closed loop structure (e.g., a rectangle).

The second conductive patterns 343 may be arranged on the rear surface of the base layer 341. Each of the second conductive patterns 343 may extend along the second direction Y. The second conductive patterns 343 may be arranged along the first direction X. Each of the second conductive patterns 343 may have a planar shape of a closed loop structure (e.g., a rectangle).

Although it is illustrated in FIG. 14 that each of the first conductive patterns 342 and the second conductive patterns 343 has a rectangular closed loop structure in a plan view, embodiments are not limited thereto, and each of the first conductive patterns 342 and the second conductive patterns 343 may have loop structures of various shapes, such as a polygonal shape, e.g., a rhombus shape, a pentagonal shape, and a hexagonal shape, a circular shape, and/or an elliptical shape in a plan view.

Each of the first conductive patterns 342 and the second conductive patterns 343 may contain a metal material, such as copper (Cu), silver (Ag), nickel (Ni), tungsten (W), and/or the like.

Each of the first conductive patterns 342 and each of the second conductive patterns 343 may intersect each other in a plan view. The magnetic field or the electromagnetic signal emitted from the electronic pen may be absorbed by the first conductive patterns 342 and the second conductive patterns 343, and it is possible to determine the position of the electronic pen with respect to the first digitizer layer 340 due to the above-described intersecting structure.

In some embodiments, at least a portion of the first conductive patterns 342 and the second conductive patterns 343 may generate a magnetic field in response to an input current, and the generated magnetic field or electromagnetic signal may be absorbed by an electronic pen. The electronic pen may emit the absorbed magnetic field again, and the magnetic field emitted by the electronic pen may be absorbed by the first conductive patterns 342 and the second conductive patterns 343. The first conductive patterns 342 and the second conductive patterns 343 may convert the magnetic field or the electromagnetic signal output from the electronic pen into an electric signal.

The first cover layer 346 may be disposed on the first conductive patterns 342. The first cover layer 346 may contain an insulating material. For example, the first cover layer 346 may contain polyimide. The first cover layer 346 may be attached onto the base layer 341 and the first conductive patterns 342 through the first bonding member 344 containing, for instance, a pressure sensitive adhesive.

The second cover layer 347 may be disposed on the second conductive pattern 343. The second cover layer 347 may contain an insulating material. For example, the second cover layer 347 may contain polyimide. The second cover layer 347 may be adhered onto the base layer 341 and the second conductive patterns 343 through the second bonding member 345 containing, for example, a pressure sensitive adhesive.

Referring back to FIG. 12, the shielding member 350 may be disposed on the rear surface of the digitizer layer 340. The shielding member 350 may be attached onto the rear surface of the digitizer layer 340 by the eighth adhesive layer 365. Since the shielding member 350 may contain a magnetic metal powder (MMP), the magnetic field or the electromagnetic signal that has passed through the digitizer layer 340 may flow into the shielding member 350. Therefore, the shielding member 350 may reduce the emission of the magnetic field or the electromagnetic signal to the rear surface of the display device 2.

The fourth to eighth adhesive layers 361, 362, 363, 364, and 365 for attaching the above-described rear stacked structure 300 may contain, for instance, a pressure sensitive adhesive, but embodiments are not limited thereto.

Although it is illustrated in FIG. 11 that the rear stacked structure 300 is disposed across the first non-folding area NFA1, the folding area FDA, and the second non-folding area NFA2, at least one layer of the rear stacked structure 300 may be separated (or removed) from the folding area FDA and disposed in the first non-folding area NFA1 and the second non-folding area NFA2 to allow the display device 2 to be folded easily. In this case, at least one of the fourth to eighth adhesive layers 361 to 365 may be separated from the folding area FDA and disposed in the first non-folding area NFA1 and the second non-folding area NFA2.

Figure 16:
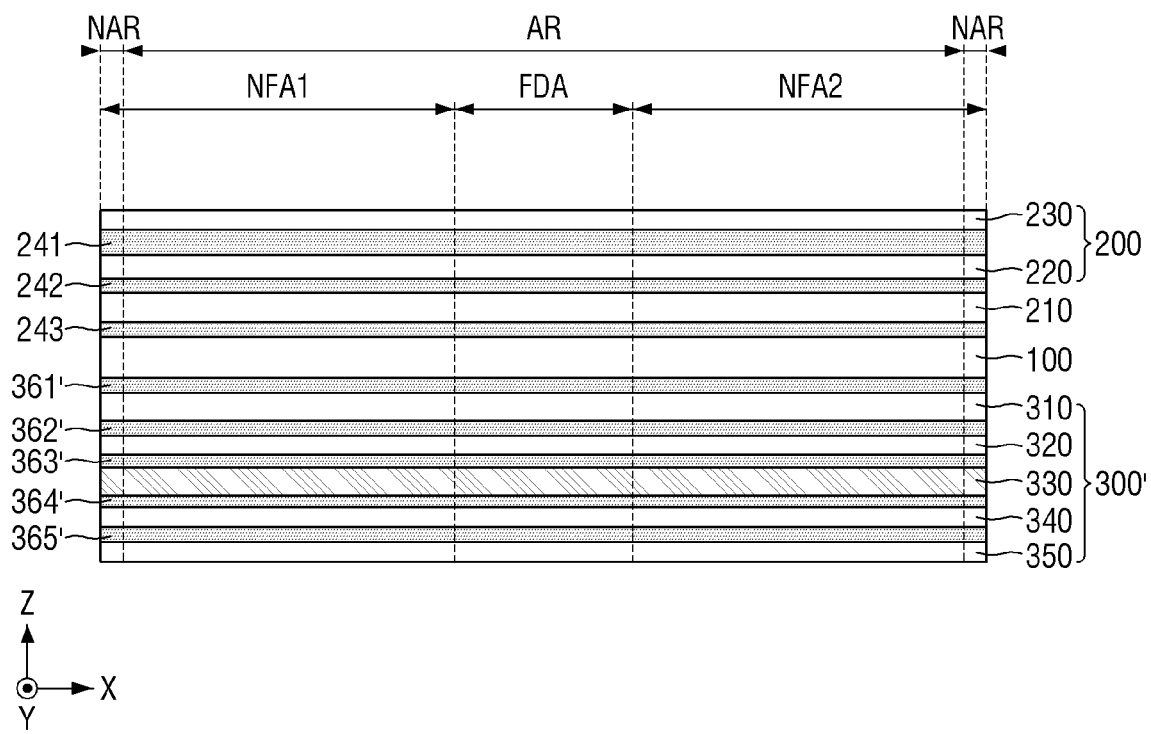
FIG. 16 is a cross-sectional view of a display device according to an embodiment.

FIG. 16 is a cross-sectional view of a display device according to an embodiment.

The display device 2 of FIG. 16 is different from that of the embodiment of FIG. 12 in that at least one of the fourth to eighth adhesive layers 361', 362', 363', 364', and 365', which is an ultraviolet curable adhesive containing vinylsilane and hydrosilane, is cured by ultraviolet rays, and thus, contains silane-$CH_2$—$CH_2$-silane. Hereinafter, the description of FIG. 16, will focus on differences from the embodiment of FIG. 12.

At least one of the fourth to eighth adhesive layers 361' to 365' contained in the rear stacked structure 300 may be substantially the same as the adhesive layer 20 of FIG. 1. When at least one of the fourth to eighth adhesive layers 361' to 365' arranged on the rear surface of the display panel 100, as well as at least one of the first to third adhesive layers 241 to 243 arranged on the front surface of the display panel 100 are photocurable adhesives containing silane-$CH_2$—$CH_2$-silane, it may be more advantageous to prevent permanent deformation even if an external pressure is applied from the front surface of the display device.

Among the fourth to eight adhesive layers 361' to 365', the adhesive layer containing silane-$CH_2$—$CH_2$-silane may have a thickness of 10 µm to 100 µm. When the thickness is smaller than 10 µm, the adhesive layer may be easily deformed, but may not be easily restored to the shape before the deformation. Further, when the thickness is greater than 100 µm, it may be difficult to bend the display device, and buckling or peeling off may occur due to repeated deformation.

Hereinafter, various embodiments will be described in more detail through fabrication examples and experimental examples.

Fabrication Examples 1 to 4

Ultraviolet curable adhesive layers containing silane-$CH_2$—$CH_2$-silane and having various storage moduli were fabricated by adjusting a molecular weight and a cross-linking amount of an adhesive composition containing vinylsilane, hydrosilane and/or any one of the above-described cross-linking agents.

Experimental Example 1

The storage modulus at −20° C. and the storage modulus at 25° C. of the ultraviolet curable adhesive layers according to Fabrication Examples 1 to 4 were measured, and the results are shown in the following Table 1.

TABLE 1

|  | Storage modulus (A) at −20° C. | Storage modulus (B) at 25° C. | Ratio (A/B) of storage modulus (A) at −20° C. to storage modulus (B) at 25° C. |
| --- | --- | --- | --- |
| Fabrication Example 1 | 0.08 MPa | 0.09 MPa | 0.89 |
| Fabrication Example 2 | 0.15 MPa | 0.14 MPa | 1.07 |
| Fabrication Example 3 | 0.18 MPa | 0.11 MPa | 1.64 |
| Fabrication Example 4 | 0.22 MPa | 0.20 MPa | 1.10 |

Referring to Table 1, in Fabrication Example 1, the storage modulus at −20° C. was measured to be 0.08 MPa and the storage modulus at 25° C. was measured to be 0.09 MPa. Accordingly, the ratio of the storage modulus at −20° C. to the storage modulus at 25° C. in Fabrication Example 1 was calculated to be about 0.89.

In Fabrication Example 2, the storage modulus at −20° C. was measured to be 0.15 MPa and the storage modulus at 25° C. was measured to be 0.14 MPa. Accordingly, in Fabrication Example 2, the ratio of the storage modulus at −20° C. to the storage modulus at 25° C. was calculated to be about 1.07.

In Fabrication Example 3, the storage modulus at −20° C. was measured to be 0.18 MPa and the storage modulus at 25° C. was measured to be 0.11 MPa. Accordingly, the ratio of the storage modulus at −20° C. to the storage modulus at 25° C. was calculated to be about 1.64.

In Fabrication Example 4, the storage modulus at −20° C. was measured to be 0.22 MPa and the storage modulus at 25° C. was measured to be 0.20 MPa. Accordingly, the ratio of the storage modulus at −20° C. to the storage modulus at 25° C. was calculated to be about 1.10.

In the following, Fabrication Examples in which the ultraviolet curable adhesive layers according to Fabrication Examples 1 to 4 are applied to the adhesive layer of the display device and Experimental Example using the same will be described.

Fabrication Example 5

The ultraviolet curable adhesive layer according to Fabrication Example 1 was applied to each of the positions of the first adhesive layer 241 and the second adhesive layer 242 of FIG. 12, and the pressure sensitive adhesive was applied to the other third to eighth adhesive layers 243, and 361 to 365. In this manner, a foldable display device folded in a direction in which display surfaces face each other as shown in FIG. 11 was fabricated.

Fabrication Example 6

A foldable display device was fabricated in the same manner as that in Fabrication Example 5, except that the ultraviolet curable adhesive layer according to Fabrication Example 2 was applied to each of the positions of the first adhesive layer 241 and the second adhesive layer 242 of FIG. 12.

Fabrication Example 7

A foldable display device was fabricated in the same manner as that in Fabrication Example 5, except that the ultraviolet curable adhesive layer according to Fabrication Example 3 was applied to each of the positions of the first adhesive layer 241 and the second adhesive layer 242 of FIG. 12.

Fabrication Example 8

A foldable display device was fabricated in the same manner as that in Fabrication Example 5, except that the ultraviolet curable adhesive layer according to Fabrication Example 4 was applied to each of the positions of the first adhesive layer 241 and the second adhesive layer 242 of FIG. 12.

Fabrication Example 9

A foldable display device was fabricated in the same manner as that in Fabrication Example 5, except that the ultraviolet curable adhesive layer according to Fabrication Example 1 was applied to each of the positions of the first adhesive layer 241, the second adhesive layer 242, the third adhesive layer 243, and the fourth adhesive layer 361 of FIG. 12.

Fabrication Example 10

A foldable display device was fabricated in the same manner as that in Fabrication Example 5, except that the ultraviolet curable adhesive layer according to Fabrication Example 1 was applied to each of the positions of the first adhesive layer 241, the second adhesive layer 242, the third adhesive layer 243, the fourth adhesive layer 361, the fifth adhesive layer 362, and the sixth adhesive layer 363 of FIG. 12.

Experimental Example 2

The number of times of folding and the number of occurrences of pen writing failure were measured in the foldable display devices according to Fabrication Examples 5 to 10.

A process from folding to unfolding of the display device at room temperature of 25° C. was set to one cycle, and the number of times of folding was calculated until the display device was not restored to the state before the folding.

The number of occurrences of pen writing failure, which is the number of times in which a pressure is applied to the front surface of the display device with a force of 500 gf (gram force, about 5 N) using an electronic pen with a diameter of about 0.6 mm at room temperature of 25° C., was calculated until permanent deformation occurred on the front surface of the display device and was visually recognized.

The results of Experimental Example 2 are shown in Table 2.

TABLE 2

| | Adhesive composition | Adhesive layer application position | Number of times of folding | Number of occurrences of pen writing failure |
|---|---|---|---|---|
| Fabrication Example 5 | Fabrication Example 1 | First and second adhesive layers (241, 242) | 300,000 | 3,000 |
| Fabrication Example 6 | Fabrication Example 2 | First and second adhesive layers (241, 242) | 200,000 | 3,000 |
| Fabrication Example 7 | Fabrication Example 3 | First and second adhesive layers (241, 242) | 200,000 | 3,000 |
| Fabrication Example 8 | Fabrication Example 4 | First and second adhesive layers (241, 242) | 150,000 | 5,000 |
| Fabrication Example 9 | Fabrication Example 1 | First to fourth adhesive layers (241-243, 361) | 300,000 | 4,000 |
| Fabrication Example 10 | Fabrication Example 1 | First to sixth adhesive layers (241-243, 361-363) | 300,000 | 5,000 |

Referring to Table 2, when the ultraviolet curable adhesive layer according to Fabrication Example 1 was applied to the first adhesive layer 241 and the second adhesive layer 242, in Fabrication Example 5 in which each of the first adhesive layer 241 and the second adhesive layer 242 has a storage modulus of 0.09 MPa at 25° C., the number of times of folding was 300,000 and the number of occurrences of pen writing failure was 3,000.

When the ultraviolet curable adhesive layer according to Fabrication Example 2 or 3 was applied to the first adhesive layer 241 and the second adhesive layer 242, in Fabrication Example 6 in which each of the first adhesive layer 241 and the second adhesive layer 242 has a storage modulus of 0.14 MPa at 25° C. that greater than 0.09 MPa, and Fabrication Example 7 in which each of the first adhesive layer 241 and the second adhesive layer 242 has a storage modulus of 0.11 MPa at 25° C. that is greater than 0.09 MPa, the number of times of folding was 200,000 and the number of occurrences of pen writing failure was 3,000.

When the ultraviolet curable adhesive layer according to Fabrication Example 4 was applied to the first adhesive layer 241 and the second adhesive layer 242, in Fabrication Example 8 in which each of the first adhesive layer 241 and the second adhesive layer 242 has a storage modulus of 0.20 MPa at 25° C. that is greater than 0.14 MPa, the number of times of folding was 150,000 and the number of occurrences of pen writing failure was 5,000.

Further, when the ultraviolet curable adhesive layer according to Fabrication Example 1 was applied to the first to fourth adhesive layers 241, 242, 243, and 361, in Fabrication Example 9 in which each of the first to fourth adhesive layers 241, 242, 243, 361 has a storage modulus of 0.09 MPa at 25° C., the number of occurrences of pen writing failure was 4,000. When the ultraviolet photocurable adhesive layer according to Fabrication Example 1 was applied to the first to sixth adhesive layers 241 to 243 and 361 to 363, in Fabrication Example 10 in which each of the first to sixth adhesive layers 241 to 243 and 361 to 363 has a storage modulus of 0.09 MPa at 25° C., the number of times of folding was 300,000 and the number of the occurrences of pen writing failure was 5,000.

Although certain embodiments and implementations have been described herein, other embodiments and modifications will be apparent from this description. Accordingly, the inventive concepts are not limited to such embodiments, but rather to the broader scope of the accompanying claims and various obvious modifications and equivalent arrangements as would be apparent to one of ordinary skill in the art.

What is claimed is:

1. A display device including a folding area and a non-folding area, the display device comprising:
a display panel having a front surface, the display panel being configured to display an image on the front surface; and
a front stacked structure disposed on the front surface of the display panel,
wherein:
the front stacked structure comprises an adhesive layer disposed across the folding area and the non-folding area;
the adhesive layer comprises an ultraviolet curable adhesive and silane-$CH_2$-$CH_2$-silane;
the ultraviolet curable adhesive comprises vinylsilane and hydrosilane; and
the adhesive layer has a storage modulus of 0.05 MPa to 0.3 MPa within a temperature range of −20° C. to 25° C.

2. The display device of claim 1, wherein a ratio (A/B) of a storage modulus (A) at −20° C. to a storage modulus (B) at 25° C. of the adhesive layer ranges from 0.5 to 2.0.

3. The display device of claim 1, wherein:
the adhesive layer further comprises a cross-linking agent; and
the cross-linking agent comprises at least one of vinylsilane, hydroxysilane, alkoxysilane, and epoxysilane.

4. The display device of claim 1, further comprising:
a touch layer disposed on the display panel, the touch layer being configured to detect a touch input,
wherein the adhesive layer has a storage modulus of 0.05 MPa to 0.2 MPa at 25° C.

5. The display device of claim 4, wherein:
the touch layer is a digitizer layer disposed on a rear surface of the display panel; and
the touch layer comprises a plurality of conductive patterns configured to detect a magnetic field or an electromagnetic signal applied from an electronic pen.

6. A display device comprising:
a display panel;
a first upper cover member disposed on the display panel;
a second upper cover member disposed on the first upper cover member;
a third upper cover member disposed on the second upper cover member;
a first lower cover member disposed under the display panel;
a second lower cover member disposed under the first lower cover member;
a third lower cover member disposed under the second lower cover member;
a first bonding layer disposed between the third upper cover member and the second upper cover member;
a second bonding layer disposed between the second upper cover member and the first upper cover member;
a third bonding layer disposed between the first upper cover member and the display panel;
a fourth bonding layer disposed between the display panel and the first lower cover member;
a fifth bonding layer disposed between the first lower cover member and the second lower cover member; and
a sixth bonding layer disposed between the second lower cover member and the third lower cover member,
wherein:
each of the first bonding layer and the second bonding layer is an ultraviolet curable layer; and
each of the first bonding layer and the second bonding layer has a storage modulus of 0.08 MPa to 0.3 MPa at −20° C. and a storage modulus of 0.05 MPa to 0.2 MPa at 25° C.

7. The display device of claim 6, wherein:
the first upper cover member is a polarizing film configured to reduce reflection of external light;
the second upper cover member is a window configured to protect the display panel; and
the third upper cover member is a window protective film configured to perform at least one of prevention of scattering, impact absorption, prevention of scratching, and prevention of glare on the window.

8. The display device of claim 6, wherein:
each of the third bonding layer and the fourth bonding layer is an ultraviolet curable layer; and
each of the third bonding layer and the fourth bonding layer has a storage modulus of 0.08 MPa to 0.3 MPa at −20° C. and a storage modulus of 0.05 MPa to 0.2 MPa at 25° C.

9. The display device of claim 8, wherein:
the first lower cover member is a panel lower protective film configured to protect the display panel;
the second lower cover member is a buffer member configured to absorb an external impact; and
the third lower cover member is a supporting member configured to support the display panel.

10. The display device of claim 9, wherein:
each of the fifth bonding layer and the sixth bonding layer is an ultraviolet curable layer; and
each of the fifth bonding layer and the sixth bonding layer has a storage modulus of 0.08 MPa to 0.3 MPa at −20° C. and a storage modulus of 0.05 MPa to 0.2 MPa at 25° C.

11. The display device of claim 9, wherein a ratio (A/B) of a storage modulus (A) at −20° C. to a storage modulus (B) at 25° C. of each of the first to sixth bonding layers ranges from 0.8 to 1.2.

12. The display device of claim 9, wherein each of the first to sixth bonding layers has a thickness of 10 μm to 100 μm.

13. The display device of claim 6, wherein each of the first bonding layer and the second bonding layer comprises vinylsilane and hydrosilane.

14. The display device of claim 13, wherein each of the first bonding layer and the second bonding layer comprises silane-$CH_2$-$CH_2$-silane.

15. An electronic product comprising:
a first structure;
a second structure; and
an adhesive layer interposed between the first structure and the second structure to bond the first structure to the second structure, the adhesive layer comprising an ultraviolet curable material,
wherein the adhesive layer has a storage modulus of 0.08 MPa to 0.3 MPa at −20° C. and a storage modulus of 0.05 MPa to 0.2 MPa at 25° C., and wherein a ratio (A/B) of a storage modulus (A) at −20° C. to a storage modulus (B) at 25° C. of the adhesive layer ranges from 0.5 to 2.0.

16. The electronic product of claim 15, wherein the storage modulus of the adhesive layer increases as a temperature increases within a temperature range of −20° C. to 25° C.

17. The electronic product of claim 15, wherein the adhesive layer comprises vinylsilane and hydrosilane.

18. The electronic product of claim 17, wherein the adhesive layer comprises silane-$CH_2$-$CH_2$-silane.

* * * * *